INVENTORS
ADALBERTUS H.J. NIEVEEN &
VAN DIJKUM
BY
Frank R. Jifani
AGENT

INVENTORS
ADALBERTUS H.J. NIEVEEN
VAN DIJKUM
BY
Frank R. Trifari
AGENT

United States Patent Office 3,493,869

Patented Feb. 3, 1970

3,493,869

TRANSISTOR MIXING CIRCUIT HAVING A CONVERSION GAIN CONTROLLED BY FORWARD CONTROL OF THE MIXER TRANSISTOR

Adalbertus Hermanus Jacobus Nieveen van Dijkum, Nijmegen, Netherlands, assignor, by mesne assignments, to U.S. Philips Corporation, New York, N.Y., a corporation of Delaware Filed Oct. 7, 1964, Ser. No. 402,230
Claims priority application Netherlands, Oct. 25, 1963, 299,786; Feb. 1, 1964, 6400843; Feb. 6, 1964, 6400959
Int. Cl. H04b *1/28*
U.S. Cl. 325—451 7 Claims

ABSTRACT OF THE DISCLOSURE

In a transistor mixing circuit an unbypassed resistor is connected in series in the emitter circuit, and a gain control voltage is applied to the series circuit of the emitter-base junction and resistor in the forward sense with respect to the junction.

This invention relates to controllable transistor mixing circuits for converting a modulated input signal, which is active in combination with the oscillation from an oscillator, across the emitter-base junction of a transistor, into an intermediate frequency output signal. The conversion gain of the circuits is controlled by control of the direct-current adjustment of the transistor.

Such transistor mixing circuits may be used, for example, in apparatus for receiving radio signals and operating on the so-called superheterodyne principle.

In such receiving apparatus one or more stages are usually equipped with automatic gain control in order that the level of the signal supplied by the receiver is substantially constant and independent of the considerable differences which frequently occur in the lever of the aerial signal fed to the receiver. The first stage, which has an input circuit connected to the aerial, is then of particular importance. This stage, which is preferably designed as a mixing stage, must be capable of bringing about a controllable reduction in amplification of the signal such that overdriving of the subsequent stages is avoided at any time, and this first stage itself must also be capable of dealing with the sometimes very strong signal from the aerial wtihout impermissible distortion.

For receivers equipped with vacuum tubes, it has been found possible to design controllable mixing tubes which satisfy the above-mentioned requirements. Known controllable transistorised mixing circuits, however, are unable to deal with the frequently occurring strong signals from the aerial without distortion so that it is necessary to include additional means suitable for this purpose, for example, a high-frequency pre-stage having an associated tuning means.

Another disadvantage of known controllable transistorised mixing circuits is that the transistor exerts a damping effect on the resonant circuits connected thereto, and this damping effect greatly varies with the control action so that the selectivity of the receiver is influenced by the control.

An object of the invention is to provide a controllable transistor mixing circuit in which the above-mentioned disadvantages are overcome and having properties which are equivalent to those of existing mixing circuits using vacuum tubes. According to the invention the emitter circuit of the mixer transistor includes a non-decoupled emitter-resistance, and the conversion gain is reduced by forward control of the transistor.

It is to be noted that the term "forward control" of the transistor is to be understood to mean the increasing of the emitter-direct-current either directly by control of the emitter or indirectly by control of the base.

Reduction of the gain of a transistor amplifier stage by forward control is already known. In this case use is made of transistors which have been specially developed for this purpose, the current gain factor in the frequency range employed being greatly dependent upon the emitter-collector direct current. The gain reduction in the mixing circuit according to the invention is based, however, on a quite and different principle, that is to say, it is based upon the type of circuit employed instead of the type of transistor. Thus in circuit arrangements according to the invention transistors can be used in which the above-mentioned dependency does not occur.

In order that the invention may be readily carried into effect, it will now be described in detail, by way of example, with reference to the accompanying diagrammatic drawings, in which.

Figure 1:
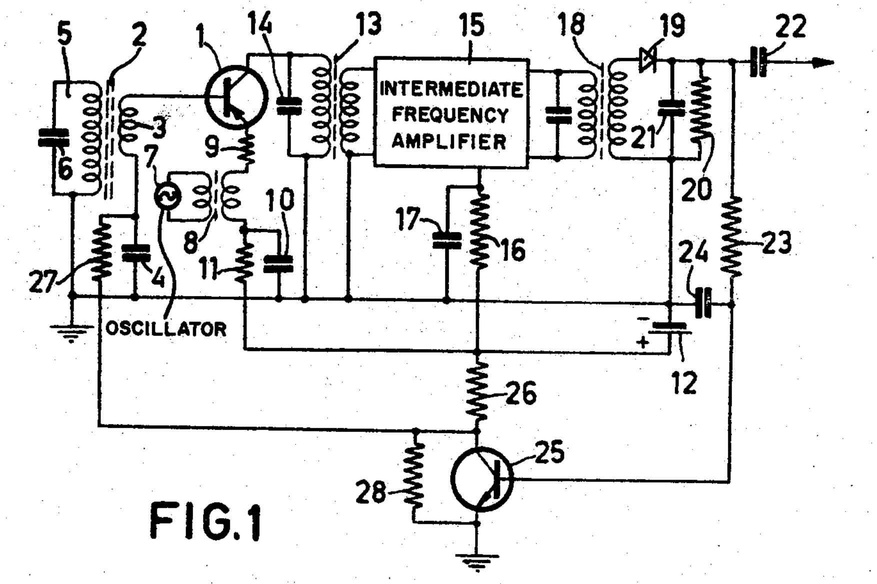
FIGURE 1 shows a receiving circuit arrangement, including a controllable transistor mixing circuit according to the invention, and employing a separate oscillator.

The receiving circuit arrangement of FIGURE 1 includes a transistor 1 which fulfils the function of a mixing transistor. The high-frequency signals having low-frequency modulation are received by means of an aerial rod 2 and fed to transistor 1 by means of a winding 3. One end of this winding is connected to the base of the mixing transistor and its other end is connected to ground for alternating currents through a capacitor 4. The receiver is tuned to the desired high-frequency signals by means of a resonant circuit 5 which includes a variable capacitor 6.

The oscillations required for the mixing process in transistor 1 are derived from an oscillator 7, shown diagrammatically, and supplied through a transformer 8 to the emitter circuit of transistor 1. The emitter circuit includes a non-decoupled resistor 9 which forms an essential part of the present invention and the function of which will be explained more fully hereinafter. The emitter circuit also includes a resistor 11 which is decoupled by a capacitor 10 and which serves for the temperature stabilization of the mixing transistor. The direct-current supply for the mixing transistor is obtained by connecting resistor 11 to the positive terminal of a supply voltage source 12.

The collector circuit of transistor 1 includes a transformer 13 which is tuned by means of a capacitor 14 to the intermediate-frequency signal, which is the signal resulting from the mixing process in transistor 1 and having a frequency which is equal, for example, to the difference between the frequency of the oscillator and the frequency of the high-frequency signal. The intermediate-frequency signal is amplified in an intermediate-frequency amplifier 15, shown diagrammatically, which receives its direct-current supply through a resistor 16 and a decoupling capacitor 17 from the supply voltage source 12. The amplified intermediate-frequency signal is applied through a transformer 18 tuned to this signal to a detecting diode 19.

Due to the detecting action of said diode, the demodulated low-frequency signal appears at the detection filter, connected to the cathode of the diode and which is constituted by a resistor 20 and a small parallel capacitor 21, said low-frequency signal being passed on through a coupling capacitor 22 to, for example, a low-frequency amplifier, not shown. A positive direct voltage appears at the cathode of the detecting diode. This direct voltage is proportional to the mean amplitude of the intermediate-frequency signal applied to the diode 19 and is used as a control voltage for automatic gain control in the receiving circuit arrangement shown.

For this purpose the direct control voltage is applied through a resistor 23 and a smoothing capacitor 24 to the base of an npn type transistor 25, which fulfils the function of a direct-current amplifier. The emitter of transistor 25 is connected to ground and its collector is connected through a collector resistor 26 to the positive terminal of the supply voltage source 12. The amplified control voltage set up across resistor 26 is applied through a resistor 27 and the aerial winding 3 to the base of the mixing transistor. A resistor 28 is included between the collector of transistor 25 and ground in order that the mixing transistor 1 has the correct direct-current adjustment for a weak input signal when the transistor 25 conveys substantially no current.

The automatic gain control in the circuit arrangement of FIGURE 1 is effected in the following manner. If the signal received by the aerial increases, the positive direct voltage developed across resistor 20 by the detecting diode also increases. Said direct voltage is active between the base and the emitter of transistor 25 so that, upon increasing voltage across resistor 20, the transistor 25 conveys a greater current and hence the voltage at the collector of the said transistor decreases. The mixing transistor 1 is controlled forwardly by means of said voltage.

As will be demonstrated hereinafter, due to this forward control and in conjunction with the non-decoupled resistor 9, a very effective control of the conversion gain results, and several other favourable properties also occur.

The emitter-base junction of the transistor exhibits a non-linear current-voltage characteristic, which implies that the differential resistance $r_o$ of the said junction with respect to alternating voltages $$\left(r_0=\frac{e_{be}}{i_e}\right.$$

where $e_{be}$ is the alternating voltage between the base and the emitter and $i_e$ is the alternating current of the emitter) depends on the emitter direct current $I_e$; in fact $r_o$ is substantially inversely proportional to $I_e$.

Since the capacitors 4, 10 and the transformer 8 constitute short-circuits for the signal voltage $e_3$ set up across the winding 3, said signal voltage is applied to the series-combination of resistor 9 and the emitter-base junction. Consequently voltage division occurs whereby the voltage $e_{be}$ which is set up across the differential resistance $r_o$ of the emitter-base junction and which is active for the mixing process is only a portion of the total voltage $e_3$ supplied. From $e_{be}=i_e r_o$, $e_9=i_e R_9$ and $e_3=e_{be}+e_9$ ($e_9$ is the signal voltage across resistor $R_9$) it follows that:

$$e_{be}=e_3\frac{r_0}{r_0+R_9}$$

In practice $R_9$ may be, for example 100 ohms and $r_o$ may vary from 50 ohms to 1.5 ohms upon forward control.

From this it appears that, if the transistor is controlled forwardly upon increasing signal $e_3$ and hence the differential resistance $r_o$ of the emitter-base transition decreases, an ever-decreasing portion of the signal voltage $e_3$ participates in the mixing process.

Such a controllable voltage division obtained by the combination of the non-decoupled emitter resistor and the forwardly-controlled mixing transistor occurs, however, not only for the signal voltage but also for the oscillator voltage supplied through the transformer 8. Since the capacitors 4, 10 and the aerial winding 3 constitute short-circuits with respect to the voltage of the oscillator, this voltage is applied to the series-combination of the emitter resistor $R_9$ and the differential resistance $r_o$ of the emitter-base transition. Likewise for the signal voltage, that is upon forward control, only a decreasing portion $$r_o/r_o+R_9$$

of the total oscillator voltage, is active across the emitter-base transition of the transistor. This effect results in an additional reduction of amplification since the IF output signal provided by the mixing transistor is not only proportional to the value of the signal voltage active across the emitter-base transition but also proportional to the value of the oscillator voltage active across said transition.

A third reason for the increased reduction in amplification upon forward control is the negative feedback for intermediate-frequency brought about by the emitter resistor 9; the intermediate-frequency current produced by the mixing process flows through the collector circuit and the emitter circuit and sets up an intermediate-frequency voltage across resistor 9. However, since transformer 8, the capacitors 4, 10 and the aerial winding 3 constitute short-circuits for the intermediate-frequency signal the intermediate-frequency voltage set up across resistor 9 is also active between the base and the emitter of the mixing transistor and causes there a negative feedback for the intermediate-frequency signal. This negative feedback increases as the differential resistance $r_o$ of the emitter-base transition decreases. Said negative feedback may actually be regarded as a linearisation of the emitter-base characteristic with the aid of which characteristic the mixing process takes place. It appears that said intermediate-frequency negative feedback brings about an additional reduction in amplification according to the expression $$r_o/r_o+R_9$$

The three above-mentioned effects, that is to say: the voltage division for the signal voltage, the voltage division for the oscillator voltage and the intermediate-frequency negative feedback provide together a high reduction in amplification upon forward control which in practice is more than sufficient to avoid overdriving of the intermediate-frequency amplifier 15.

Another advantage of the controllable mixing circuit according to the invention is that high signal voltages can be applied without impermissible modulation distortion occurring. This is the result of the above-mentioned voltage division which occurs for the signal voltage between the emitter resistor 9 and the differential resistance $r_o$; if the input signal provided by the aerial increases, and hence the risk of modulation distortion increases, the increasing forward control causes a decreasing portion of the total signal voltage to be active across the base-emitter junction. Consequently, circuit arrangements according to the invention can deal with much higher signal voltages than, for example, a mixing circuit controlled "downwardly" in which the complete signal voltage remains active across the base-emitter junction.

Circuit arrangements according to the invention also have favourable properties with regard to cross modulation. This is due, on the one hand, to the voltage division for the input signal which increases upon increasing forward control and, on the other hand, to the fact that the unwanted cross modulation products produced in the transistor are negatively fed back by the emitter resistor 9, resulting in additional suppression of cross modulation.

Another favourable property of the transistor mixing circuit according to the invention is that, due to the non-decoupled emitter resistor, substantially no additional and variable damping is exerted on the resonant circuits connected to the transistor due to the control action, so that the control action does not detrimentally affect the selectivity of the receiver. This may be clarified with reference to the following example.

The input resistance of the mixing transistor for the high-frequency signals is active on the aerial circuit. This input resistance $R_{ing.}$ is equal to $\alpha'$ $(r_o+R_9)$, where $\alpha'$ is the current gain factor of the transistor ($\alpha' \approx 100$). If $R_9 = 100$ ohms and $r_o$ varies between 50 ohms and 1.5 ohms due to the control, it follows that $R_{ing.}$ varies between 15 kΩ and 10.15 kΩ. The input resistance thus remains high with respect to the source impedance of the aerial circuit which applies to the transistor and which may be, for example, 1 kΩ. Thus only a negligible damping is exerted on the aerial circuit. If a non-decoupled emitter resistor were not used the input resistance $R_{ing.}$ of the mixing transistor for the aerial signals is $\alpha' r_o$ so that, if $r_o$ varies from 50 ohms to 1.5 ohms, $R_{ing.}$ would vary from 5 kΩ to 150Ω. A strong damping would thus be exerted on the aerial circuit at least over a portion of the control range.

Similarly, the emitter resistor 9 prevents the oscillator source from being damped unduly so that satisfactory operation of the oscillator is ensured. The negative feedback for intermediate-frequency across the resistor 9 also causes a considerable increase in the output impedance of the mixing stage so that no detrimental influence is exerted on the selectivity of the intermediate-frequency transformer 13 connected to the collector.

Instead of coupling the aerial signal into the base circuit and the oscillation from the oscillator into the emitter circuit, the latter oscillation may be coupled into the base circuit and the aerial signal into the emitter circuit, or both may be coupled into the base circuit or the emitter circuit. Said couplings may be effected, instead of by means of transformers, as shown in FIGURE 1, in an other manner, for example, through capacitors. The invention is also not limited to the manner in which the control voltage required in the described example is obtained.

Figure 2:
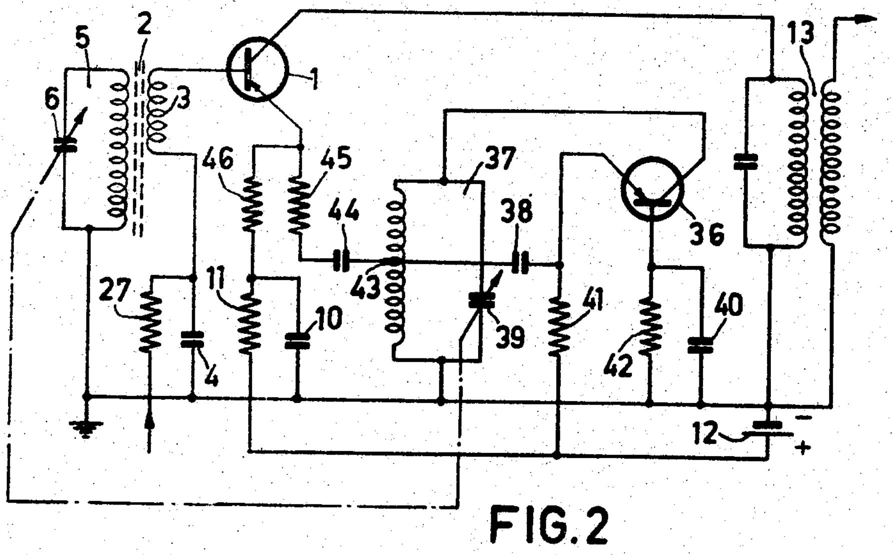
FIGURE 2 shows another receiving circuit arrangement including a controllable mixing stage according to the invention which employs a separate oscillator and FIGURE 3 shows a receiving circuit arrangement including a self-oscillating controllable transistor mixing circuit according to the invention.

One preferred example of a coupling of the oscillator voltage, is shown in FIGURE 2. This figure shows only the mixing stage, together with a detailed diagram of an oscillator connected to the mixing stage. Said oscillator comprises an oscillator transistor 36 the collector of which is coupled to the emitter through a resonant circuit 37 and a coupling capacitor 38. The resonant circuit 37 may be tuned to the desired frequency of the oscillator by means of a variable capacitor 39 which is preferably mechanically coupled to the capacitor 6. The base of transistor 36 is connected to ground for the frequency of the oscillator by means of a capacitor 40. Resistors 41 and 42 provide the direct-current adjustment of the emitter and the base, respectively, of the oscillator transistor.

The oscillations produced by the oscillator are derived from a tapping 43 on the inductor of the resonant circuit 37 and fed to the emitter of the mixing transistor through a direct-voltage separating capacitor 44 and a non-decoupled resistor 45. The emitter circuit of the mixing transistor also includes a second non-decoupled resistor 46 and a resistor 11 which is decoupled by means of a capacitor 10, the latter resistor serving, as in FIGURE 1, for the temperature stabilization of the transistor.

In contrast with the circuit arrangement shown in FIGURE 1, which the emitter circuit of the mixing transistor includes one non-decoupled emitter resistor, the emitter circuit in the circuit arrangement according to the present example includes two non-decoupled emitter resistors 45 and 46, the oscillation from the oscillator being fed through one of them (i.e. resistor 45) to the emitter of the mixing transistor.

The two resistors are actually connected in parallel with respect to the alternating currents flowing through the emitter of the mixing transistor, for a portion of this current flows through resistor 46 and capacitor 10 to ground and the other portion flows through resistor 45, capacitor 44 and resonant circuit 37 to ground. The resistors 45 and 46 have values such as to form together the same resistance as the non-decoupled emitter resistor required for correct control action in FIGURE 1. For example, if the total resistance required is 100 ohms, the resistors 45 and 46 may be given values of, for example, 330 ohms and 150 ohms respectively.

The advantages obtained by this step may be explained more fully hereinafter.

A high-frequency signal current modulated, for example, in amplitude flows through the emitter circuit of the mixing transistor. Said high-frequency signal current flows completely through said resistor and the oscillator source if a single non-decoupled emitter resistor is used. This is not objectionable if said source has a sufficiently low resistance for the signal frequency, but if the signal frequency and the oscillator frequency are comparatively close to each other (as is the case, for example, in short-wave radio reception) the resonant circuit of the oscillator can no longer be regarded as a negligibly low resistance for the signal frequencies and the signal current flowing through said circuit thus causes a considerable signal voltage across the oscillator circuit. The modulation present on this voltage is thus modulated on the oscillation from the oscillator in the oscillator transistor so that not only the signal voltage fed to the mixing transistor is modulated but also the oscillator voltage fed to the said transistor. This results in strong modulation distortion of the IF output signal.

By dividing the required emitter resistor into two resistors 45 and 46 it is achieved firstly that a large portion of the signal current flowing through the emitter circuit now flows through resistor 46 so that the signal voltage across the oscillator remains low and secondly, that a resistor 45 of higher resistivity can be present between the oscillator circuit 37 and the emitter of transistor 1. This means that oscillations of greater amplitude may be generated by the oscillator, which implies that any residual high-frequency signal voltages occurring across the oscillator have less influence on the operation of the oscillator.

Another important advantage of the division of the emitter resistor in the manner shown in FIGURE 2, so that the use of this step is also important if the oscillator frequency and the signal frequency differ greatly, is that, due to the resistor 45 of higher resistivity between the oscillator circuit and the mixing transistor, the input resistance ($r_o$) of the mixing transistor, which varies with the control, has less influence on the frequency of the oscillator.

Figure 3:
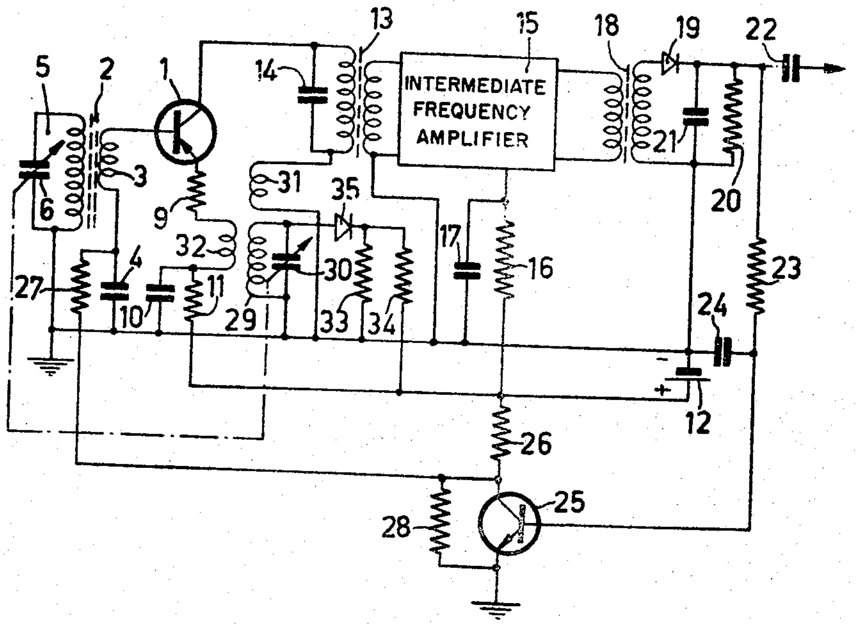

FIGURE 3 shows a receiving circuit-arrangement which utilizes a self-oscillating controllable transistor mixing circuit. The components corresponding to those of FIGURE 1 are indicated by the same reference numerals in FIGURE 3.

The aerial circuit, the intermediate-frequency amplifier, the detecting circuit and the control-voltage amplifier are connected in this embodiment in the same manner as in FIGURE 1 and these elements of the arrangement need therefore no further explanation.

The circuit arrangement includes an oscillator circuit 29 which may be tuned to the desired frequency by means of a variable capacitor 30 which is preferably mechanically coupled to the capacitor 6. A winding 31 included in the collector circuit of the mixing transistor 1 and a winding 32 included in the emitter circuit are each magnetically coupled to the resonant circuit 29. Due to the resulting feed back from the collector circuit to the emitter circuit through the resonant circuit 29, the mixing circuit oscillates at the resonant frequency of the circuit 29. In known self-oscillating mixing circuits, the amplitudes of the oscillation from the oscillator is limited by the non-linear characteristic of the mixing transistor. However, since, as previously mentioned, in the controllable mixing circuit according to the invention, the forward control has a linearizing action on the characteristic of the transistor the amplitude of the oscillator, unless special steps are taken, would increase as the forward control progresses and thus counteract the gain control. In the embodiment of FIGURE 3, in order to overcome this disadvantage, a limiting diode 35 is connected to the oscillator circuit 29 which receives a constant bias voltage with the aid of two resistors 33 and 34. The amplitude of the oscillator is thus limited to a fixed value determined by the bias voltage at the diode 35, this amplitude thus being independent of the control of the mixing transistor.

The mixing stage above described may be used in a receiver in which the gain control is effected in a plurality of stages, for example, in the mixing stage and in a high-frequency stage (not shown). As is well-known, with such controls in a plurality of stages, it is often desirable, in order to obtain a satisfactory signal-to-noise ratio or low distortion, to use delayed gain control whereby first one stage is controlled and, if further control of this stage is not possible, another stage is controlled. This principle may be realized in the circuit arrangement of FIGURE 3 by biasing the diode 35 with the aid of the resistors 33 and 34 so that the oscillation from the oscillator is limited in the oscillating mixing transistor during the first portion of the control. As has previously been demonstrated, the amplitude of the oscillation from the oscillator thus increases as he control progresses and the conversion gain remains substantially constant. Upon further control, the amplitude of the ocillator is maintained constant by the limiting action of the diode 35 so that the conversion gain decreases. Delayed gain control in the transistor mixing stage is thus obtained without any additional circuit elements.

The moment at which the limitation is taken over and hence the bend in the control characteristic occurs depends upon the characteristic of the non-linear element (diode), upon the manner in which the oscillation from the oscillator is fed to the said element, and upon the value of any bias applied thereto; it is to be noted that in many cases, for example, when using a Zener diode, but also when using ordinary diodes, it is possible to omit any biasing potential so that the resistors 33 and 34 shown in the figure can be saved.

Another particularity of the circuit arrangement with delayed gain control is that the mixing transistor can be used as a control-voltage amplifier for the whole of the control range since the emitter-collector direct current of the mixing transistor varies with the control throughout the contol range, even in the portion in which the conversion gain remains constant. The control voltage required for the control of other stages may thus be derived in amplified form from a resistor, for example resistor 11, included in the emitter circuit or the collector circuit of the mixing transistor.

A self-oscillating mixing circuit designed in practice in accordance with FIGURE 3 was proportioned as follows:

| | | |
|---|---|---|
| $C_4$ | kpf | 82 |
| $C_{10}$ | kpf | 39 |
| $R_{27}$ | kΩ | 20 |
| $R_9$ | | 100Ω |
| $R_{11}$ | | 390Ω |
| $R_{33}$ | kΩ | 2.7 |
| $R_{34}$ | kΩ | 18 |
| $V_{12}$ | volts | 12 |

What is claimed is:

1. A mixer circuit comprising a transistor having emitter, base and collector electrodes, a source of signals, an input circuit for said transistor, said input circuit comprising unbypassed resistor means connected in series with the emitter-base junction of said transistor and means applying said signals to said emitter-base junction, whereby portions of said signals are developed across said resistor means and the resistance of said junction, means for producing oscillations and applying said oscillations to said input circuit whereby portions of said oscillations are developed across said junction resistance and said resistor means, a source of a control voltage that varies in amplitude as a function of the amplitude of said signals, means for applying said control voltage to said input circuit with a polarity to increase the current flowing through said junction when the amplitude of said signals increases and output circuit means connected to said collector electrode.

2. A mixing circuit of the type comprising a transistor having emitter, base and collector electrodes, a source of signals, means producing an oscillation voltage, a source of a control voltage having an amplitude dependent upon the amplitude of said signals, input circuit means applying said signals, oscillation voltage and control voltage to the emitter-base junction of said transistor, and an intermediate frequency output circuit connected to said collector electrode; wherein the improvement comprises unbypassed resistor means connected in series with said junction whereby portions of said signals and oscillation voltage are developed across said junction and said resistor means, and said input circuit means comprises means for applying said control voltage to said junction whereby emitter direct current varies in the same sense as the amplitude of said signals.

3. A transistor mixer circuit comprising a transistor having emitter, base and collector electrodes, a source of operating potential having first and second terminals, a source of signals, an emitter circuit comprising unbypassed resistor means serially connected between said emitter electrode and first terminal, output circuit means connected between said collector electrode and second terminal, a base circuit comprising means for biasing said base electrode in the forward direction, means for producing local oscillations, means applying said signals to the base-emitter junction of said transistor, means applying said oscillations to said junction, whereby a portion of said signals and oscillations are also developed across said resistor means, a source of an automatic control voltage, and means applying said control voltage to said junction whereby direct emitter current is increased with increases in the amplitude of said signals.

4. The mixer circuit of claim 3 wherein said means applying said oscillations to said junction comprises a source of oscillations, second unbypassed resistor means for coupling said emitter circuit to a point on said source of oscillations have low impedance to said first terminal with respect to said signals, whereby said second and first mentioned resistor means are effectively in parallel with respect to said signals.

5. The mixer circuit of claim 3 wherein said means for producing local oscillations comprises regenerative feedback means coupled between said output circuit and emitter circuit, said feedback means comprising nonlinear impedance means connected to limit the amplitude of oscillations produced in said feedback means.

6. In a transistor mixer circuit of the type comprising a transistor having base, emitter and collector electrodes, an input circuit comprising means for applying modulated input oscillations and locally produced oscillations to the emitter-base junction of said transistor and means for biasing said junction in the forward direction, a source of an automatic gain control voltage, and means for applying said gain control voltage to said input circuit for varying the direct current bias on said junction; the improvement wherein said input circuit further comprises an unbypassed resistor connected in series with respect to said junction whereby portions of said input oscillations and locally produced oscillations are also developed across said resistor, and means for applying said gain control voltage to said junction with such a sense that the direct emitter current of said transistor increases with increase in the amplitudes of said input oscillations, whereby the conversion gain of said circuit is controlled as a result of changes in the relative proportions of said input oscillations and locally produced oscillations developed across said resistor and the emitter-base junction resistance of said transistor due to variation in said junction resistance with variation in emitter direct current.

7. A mixer circuit comprising a transistor having emitter, base and collector electrodes, input and output circuits connected to said electrodes with said emitter electrode in common with said circuits, a source of signals coupled to said input circuit; means for producing oscillations, an unbypassed resistor coupled in series with said emitter and in common with said input and output circuits, a source of a gain control voltage, means for applying said control voltage to the junction of said resistor and emitter electrode in the sense to increase emitter base current to said transistor with increases in the amplitude of said signals, means for applying said oscillations to said emitter electrode, and means for deriving intermediate frequency output signals from said output circuit.

References Cited

UNITED STATES PATENTS

| | | | |
|---|---|---|---|
| 2,881,310 | 4/1959 | Holmes | 325—408 XR |
| 2,891,145 | 6/1959 | Bradmiller | 325—408 XR |
| 2,935,607 | 5/1960 | Koch | 325—430 XR |
| 3,089,087 | 5/1963 | Birkenes | 325—319 |
| 3,098,199 | 7/1963 | Carney et al. | 330—29 |

OTHER REFERENCES

Department of the Army Technical Manual, Basic Theory and Applications of Transistors, TM11–690. U.S. Govt. Printing Office 1959, p. 116.

Sinclair, J. C.: In Electronic Design, p. 64, Oct. 25, 1963.

ROBERT L. GRIFFIN, Primary Examiner

R. S. BELL, Assistant Examiner

U.S. Cl. X.R.

325—409, 415; 330—85, 112